US008963291B2

(12) United States Patent
Furusawa et al.

(10) Patent No.: US 8,963,291 B2
(45) Date of Patent: Feb. 24, 2015

(54) SEMICONDUCTOR CHIP WITH SEAL RING AND SACRIFICIAL CORNER PATTERN

(75) Inventors: Takeshi Furusawa, Chiyoda-ku (JP); Noriko Miura, Chiyoda-ku (JP); Kinya Goto, Chiyoda-ku (JP); Masazumi Matsuura, Chiyoda-ku (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 850 days.

(21) Appl. No.: 13/112,738

(22) Filed: May 20, 2011

(65) Prior Publication Data

US 2011/0215447 A1 Sep. 8, 2011

Related U.S. Application Data

(63) Continuation of application No. 12/410,170, filed on Mar. 24, 2009, now Pat. No. 8,018,030, which is a continuation of application No. 11/220,603, filed on Sep. 8, 2005, now Pat. No. 7,605,448.

(30) Foreign Application Priority Data

Sep. 10, 2004 (JP) ................................. 2004-264014

(51) Int. Cl.
*H01L 21/56* (2006.01)

(52) U.S. Cl.
USPC ............ 257/620; 257/E23.127; 257/E23.181; 257/E23.193

(58) Field of Classification Search
USPC ............ 257/620, E23.127, E23.181, E23.193
See application file for complete search history.

(56) References Cited

U.S. PATENT DOCUMENTS

| 5,572,067 A | 11/1996 | Thalapaneni |
| 5,994,762 A | 11/1999 | Suwanai et al. |
| 6,028,347 A * | 2/2000 | Sauber et al. ................. 257/622 |
| 6,365,958 B1 | 4/2002 | Ibnabdeljalil et al. |
| 6,753,608 B2 | 6/2004 | Tomita |
| 7,129,565 B2 * | 10/2006 | Watanabe et al. ............. 257/620 |
| 2003/0173675 A1 | 9/2003 | Watanabe et al. |
| 2003/0213980 A1 | 11/2003 | Tanaka et al. |
| 2003/0218254 A1 | 11/2003 | Kurimoto et al. |
| 2004/0002198 A1 | 1/2004 | Lee et al. |
| 2004/0150073 A1 | 8/2004 | Matumoto et al. |

(Continued)

FOREIGN PATENT DOCUMENTS

| JP | 3-136332 A | 6/1991 |
| JP | 2003-86590 | 3/2003 |

(Continued)

OTHER PUBLICATIONS

Korean Office Action issued Sep. 28, 2011, in Patent Application No. 10-2005-0083989. (with English Translation).
Office Action issued Feb. 18, 2014 in Japanese Patent Application No. 2013-109879 with English language translation.

*Primary Examiner* — Marcos D. Pizarro
(74) *Attorney, Agent, or Firm* — Oblon, Spivak, McClelland, Maier & Neustadt, L.L.P.

(57) ABSTRACT

A semiconductor device including a low dielectric constant film of which the relative dielectric constant is less than 3.5, is provided with one or more seal rings that are moisture blocking walls forming a closed loop in a plan view, and where at least one of the seal rings includes a seal ring protrusion portion in inward protruding form in the vicinity of a chip corner.

8 Claims, 12 Drawing Sheets

(56) References Cited

U.S. PATENT DOCUMENTS

| | | |
|---|---|---|
| 2005/0087878 A1 | 4/2005 | Uesugi et al. |
| 2005/0127395 A1 | 6/2005 | Saigoh et al. |
| 2005/0269702 A1 | 12/2005 | Otsuka |
| 2006/0103025 A1 | 5/2006 | Furusawa et al. |
| 2006/0163720 A1 | 7/2006 | Hirata |

FOREIGN PATENT DOCUMENTS

| | | |
|---|---|---|
| JP | 2003-338504 | 11/2003 |
| JP | 2004-172169 | 6/2004 |
| JP | 2004-253773 | 9/2004 |
| JP | 2006-41244 | 2/2006 |
| KR | 10-2003-0074449 | 9/2003 |

* cited by examiner

BACKGROUND ART

BACKGROUND ART

SEMICONDUCTOR CHIP WITH SEAL RING AND SACRIFICIAL CORNER PATTERN

CROSS-REFERENCE TO RELATED APPLICATIONS

This application is a Continuation of U.S. application Ser. No. 12/410,170, filed on Mar. 24, 2009, the contents of which is incorporated herein by reference. U.S. application Ser. No. 12/410,170 is a Continuation of U.S. application Ser. No. 11/220,603, filed on Sep. 8, 2005, now U.S. Pat. No. 7,605,448, and claims the benefit of priority of Japanese Application No. 2004-264014, filed on Sep. 10, 2004.

BACKGROUND OF THE INVENTION

1. Field of the Invention

The present invention relates to a semiconductor device that includes a low dielectric constant film.

2. Description of the Background Art

With progresses in the miniaturization of semiconductor devices, the parasitic capacitance of copper wires has become approximately the same as the input/output capacitance of transistors, preventing increase in the speed of the device operation. Therefore, ways to introduce an insulating film, of which the relative dielectric constant is lower than that of a conventional silicon oxide ($SiO_2$, specific dielectric constant k~4), have been actively sought. When relative dielectric constant k becomes small, however, the physical strength of an insulating film becomes inferior. In particular, when relative dielectric constant k becomes smaller than 3.5, sufficient physical strength cannot be maintained, leading to a problem. In the following, a film of which relative dielectric constant k is smaller than 3.5 is referred to as "low dielectric constant film," in the present invention.

During heat cycle testing, after semiconductor devices have been packaged, temperature is changed, for example, from −65° C. to 150° C., and therefore, low dielectric constant films receive stress from resin portions, and as a result, in some cases, the low dielectric constant films peel. The lower the physical strength of a low dielectric constant film, the more significant peeling becomes. In addition, as for the location of peeling, it is particularly significant in the vicinity of chip corners, where stress concentrates.

In general, when moisture enters into the inside of a chip of a semiconductor device, the operation properties of the device deteriorate, and for this reason, a pattern that is referred to as a seal ring (also referred to as "guard ring") is formed, in order to prevent entering of moisture from sides on the outer periphery of the chip. The seal ring is arranged in closed loop form in a plan view, where metal portions, such as contacts and wires that are used within the chip, are aligned in the upward and downward direction, and these layers are connected to each other through a structure in trench form that is also made of metal, so that a metal wall is formed. In a plan view, the seal ring becomes rectangular, with an outer periphery that is constantly spaced from the outer periphery of the chip.

When a low dielectric constant film is destroyed due to stress that is received from resin, as described above, cracking eventually progresses and reaches the seal ring. When cracking reaches the seal ring, the seal ring is easily destroyed. Once the seal ring is destroyed, moisture enters into the inside of the chip, causing a failure in the operation of the device. Furthermore, in extreme cases, cracking may progress as much as 500 μm and, in some cases, directly cut wires inside the chip.

In order to prevent destruction of the seal ring by cracking, several technologies have been proposed. U.S. Pat. No. 6,365,958, for example, discloses an arrangement of a member having a structure where a number of layers of lattice wires are arranged so as to overlap in the upward and downward direction, and lattice wires which are on top of one another are connected by means of vias that are made of metal outside of the seal ring as a sacrifice pattern for stopping the progress of cracking. U.S. Pat. No. 5,572,067 discloses an arrangement of a sacrifice corner structure where a lower layer wire that is parallel to the direction toward the center from the corner of the chip and an upper layer wire that is oriented perpendicular to this cross each other and are connected to each other by means of a via in a chip corner portion. U.S. Patent Publication No. 2004/0002198 discloses the placement of dummy metal patterns where a non-quadrilateral seal ring is used and placed in a corner portion of the chip, where a lower layer wire and an upper layer wire are connected in lattice form on both sides of the seal ring.

Japanese Patent Laying-Open No. 2004-172169 discloses a reinforcing pattern where a lower layer wire and an upper layer wire are connected through a via and an arrangement of a reinforcing pattern in wall form made of copper in the vicinity of a chip corner.

Even in the case where a structure that becomes a sacrifice pattern is arranged in the vicinity of a chip corner in accordance with a proposed technology, such as those that have been as described above, destruction of the seal ring by cracking cannot be sufficiently prevented. In addition, when the sacrifice pattern is made too great, a problem arises where the area on which circuits or the like are arranged becomes too small.

SUMMARY OF THE INVENTION

An object of the present invention is to provide a semiconductor device which can prevent destruction of a seal ring by cracking more efficiently and without fail.

In order to achieve the aforementioned object, a semiconductor device according to the present invention is a semiconductor device which includes a low dielectric constant film of which the relative dielectric constant is less than 3.5, and which includes a seal ring protrusion provided with one or more seal rings that is a moisture blocking wall in closed loop form in a plan view, and in which at least one of the seal rings is in inward protruding form in the vicinity of a chip corner.

The above described and other objects, characteristics, aspects and advantages of this invention will be clarified in the following detailed description of this invention, and are best understood in conjunction with the accompanying drawings.

DESCRIPTION OF THE PREFERRED EMBODIMENTS

Figure 1:
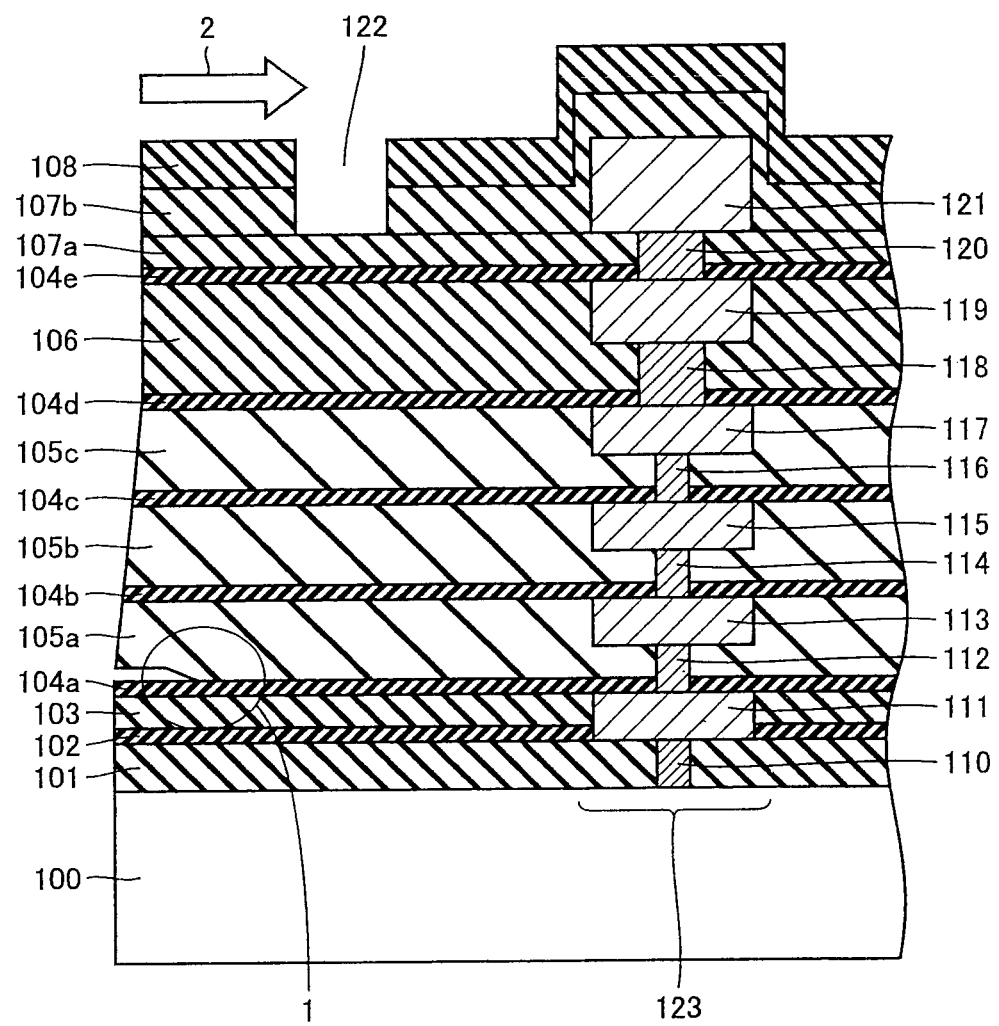
FIG. 1 is a cross-sectional view showing a portion of a semiconductor device and illustrating the state of progress of cracking that has been found by the inventors.

First, prior to making the present invention, the inventors examined in detail how cracking occurs. An actual state where cracking has occurred that was found as a result is described with reference to FIGS. 1 and 2. FIG. 1 shows a cross-sectional view in the vicinity of a chip corner of a semiconductor device. A silicon oxide film 101, a silicon carbo-nitride film 102, a silicon oxide film 103, a silicon carbo-nitride film 104a, a low dielectric constant film 105a, a silicon carbo-nitride film 104b, a low dielectric constant film 105b, a silicon carbo-nitride film 104c, a low dielectric constant film 105c, a silicon carbo-nitride film 104d, a silicon oxide film 106, a silicon carbo-nitride film 104e, a silicon oxide film 107a, a silicon oxide film 107b and a silicon nitride film 108 are layered in this order on the upper side of a semiconductor device substrate 100. A contact 110 is arranged so as to penetrate through silicon oxide film 101. A copper wire 111 is arranged on the upper side of silicon oxide film 101. An interlayer connection portion 112 is provided so as to penetrate through low dielectric constant film 105a and be connected to copper wire 111 from the top. A copper wire 113 is arranged so as to be buried in low dielectric constant film 105a on the upper side of interlayer connection portion 112. Furthermore, the same structure is repeated in the upward direction, so that an interlayer connection portion 114, a copper wire 115, an interlayer connection portion 116 and a copper wire 117 are sequentially arranged. An interlayer connection portion 118 is arranged so as to penetrate through silicon oxide film 106 and be connected to copper wire 117 from the top. A copper wire 119 is arranged so as to be buried in the silicon oxide film on the upper side of interlayer connection portion 118. An interlayer connection portion 120 is arranged so as to penetrate through silicon oxide film 107a and be connected to copper wire 119 from the top. An aluminum wire 121 is arranged on the upper side of interlayer connection portion 120. Aluminum wire 121 is arranged so as to be placed on the upper side of silicon oxide film 107a, and is covered with silicon oxide film 107b. A silicon nitride film peeling preventing trench 122 is provided by digging out a portion of silicon oxide film 107b and silicon nitride film 108 in the vicinity of the end of the chip. The contact, copper wires, interlayer connection portions and aluminum wire from contact 110 to aluminum wire 121 are in wall form, and form a seal ring 123 for preventing moisture from entering.

During heat cycle testing, a shear force is applied in the direction of arrow 2 due to contraction of the resin (not shown) that covers the upper side. Low dielectric constant films have low physical strength, and therefore, a crack 1 occurs, originating from a chip corner. The inventors have examined cracking in low dielectric constant films in detail, and as a result, have found the following.

Firstly, the inventors have found that cracks, such as crack 1, easily occur, particularly in interfaces on the lower side of low dielectric constant films. Furthermore, the inventors ascertained that the probability of cracks such as crack 1 occurring in the low dielectric constant film that is the lowest from among a number of low dielectric constant films is the highest.

Figure 2:
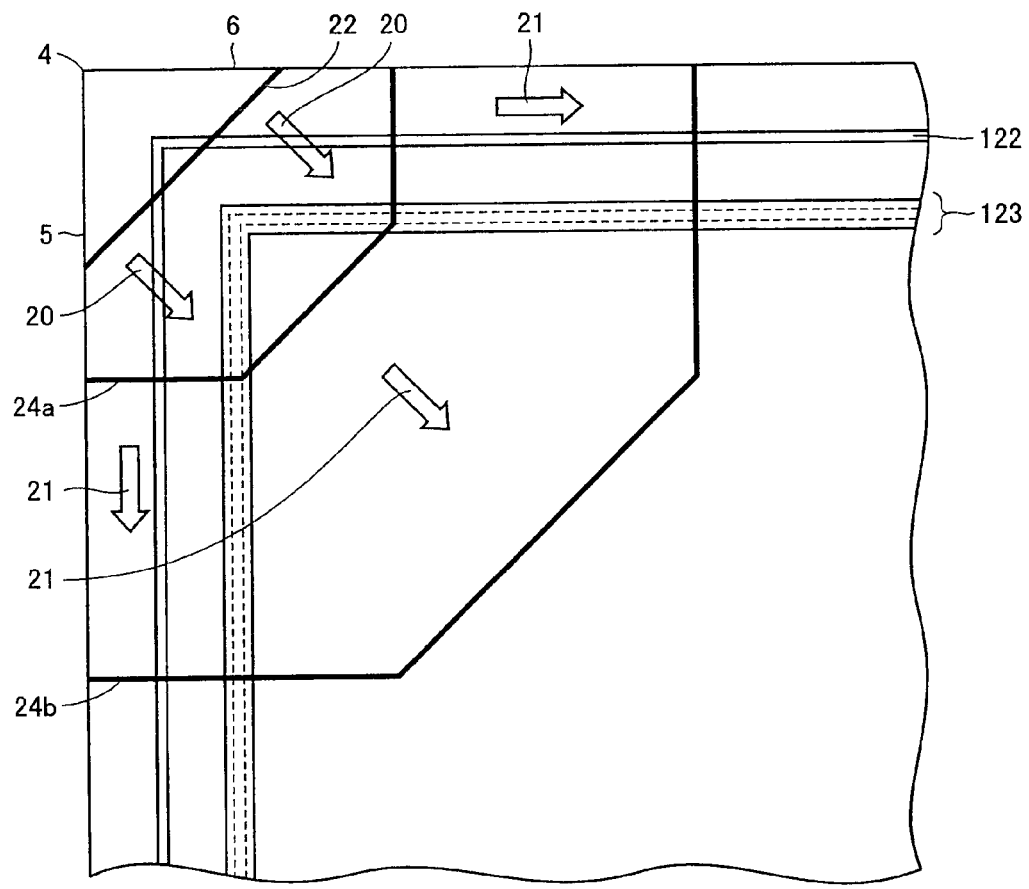
FIG. 2 is a plan view showing a portion of a semiconductor device and illustrating the state of progress of cracking that has been found by the inventors.

Secondly, the actual state of a crack while progressing is clarified in a plan view. FIG. 2 shows a plan view of this semiconductor device. Though conventionally, it has been believed that the ends of cracks originating from chip corners 4 progress in the direction of arrows 20 in a straight line 22 which forms an angle of 45° relative to two sides that form a chip corner 4, the inventors have found that the ends of cracks are not in a simple straight line, but actually progress in such a manner that they spread from a bent line 24a to a bent line 24b in the direction of arrows 21.

Figure 3:
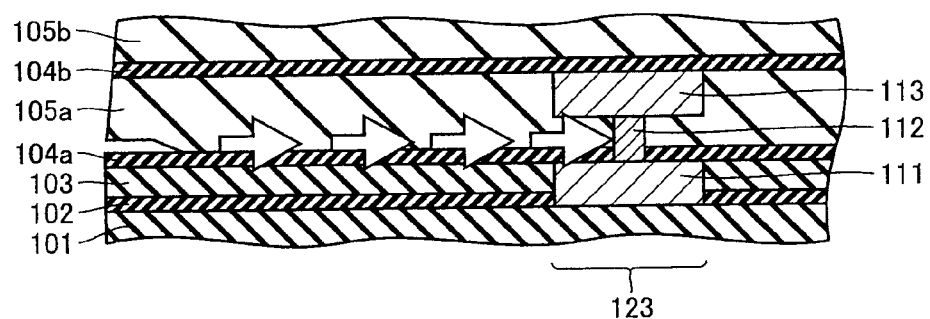
FIG. 3 is a first view illustrating the properties of a crack that has been found by the inventors.
Figure 4:
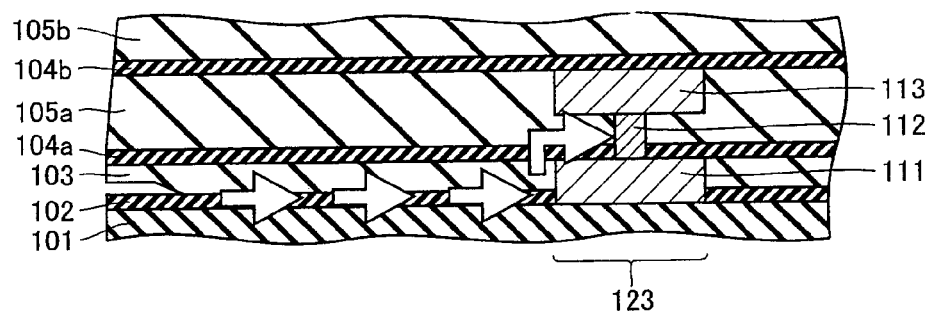
FIG. 4 is a second view illustrating the properties of a crack that has been found by the inventors.

Thirdly, it has also been found that cracks occur in the interface on the lower side of low dielectric constant film 105a, as shown in FIG. 3, and progress along this interface without changing course, and in addition, avoid copper wire 111 so as to pass over copper wire 111 and further progress along low dielectric constant film 105b when they encounter copper wire 111 which completely blocks low dielectric constant film 105a after progressing some distance, as shown in FIG. 4.

The present invention was achieved on the basis of these findings.

First Embodiment

Figure 5:
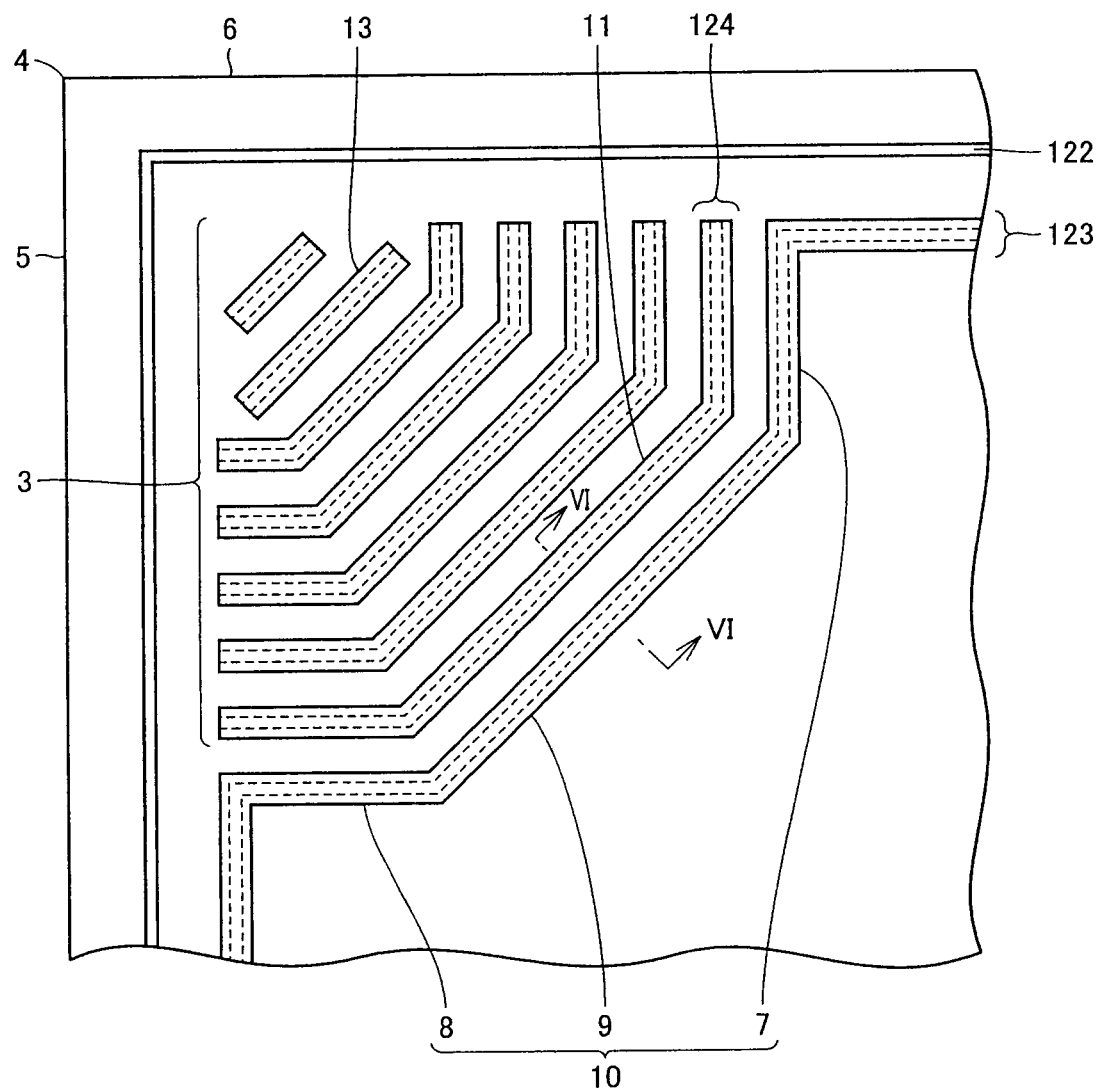
FIG. 5 is a plan view showing a portion of a semiconductor device according to the first embodiment of the present invention.
Figure 6:
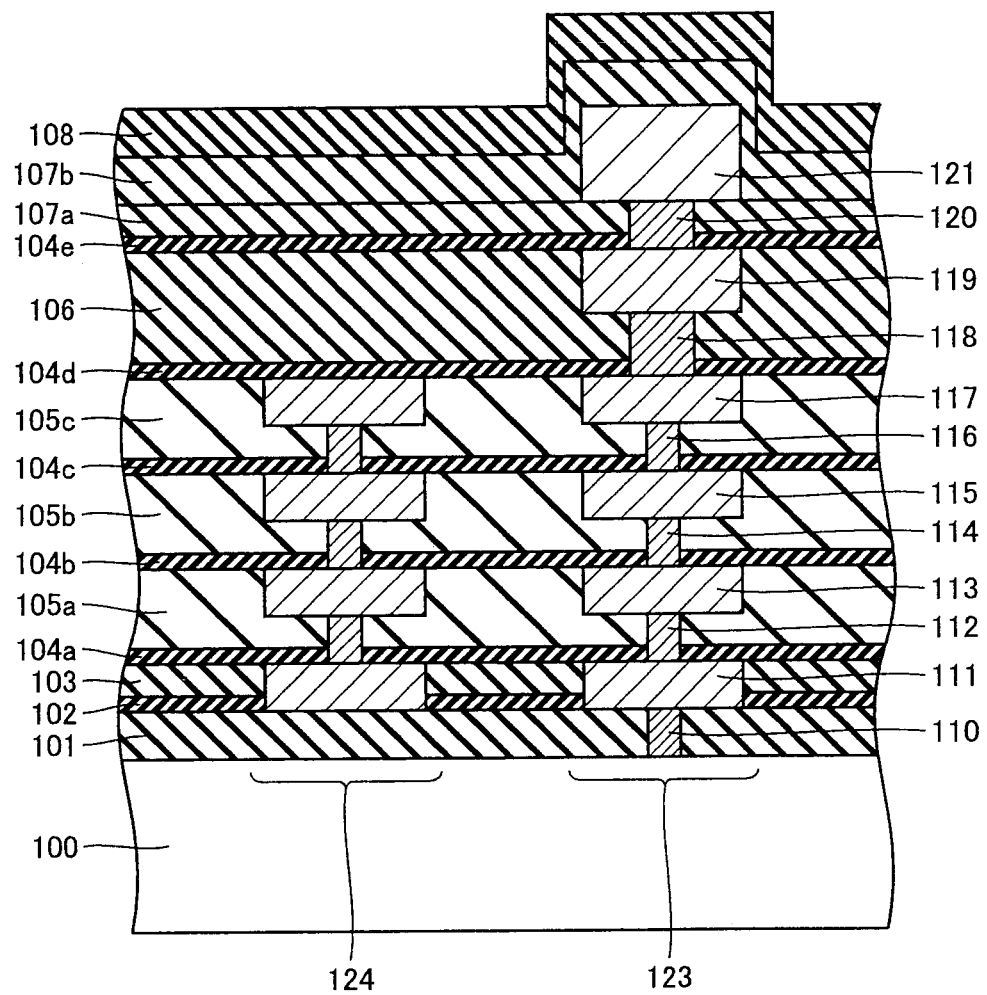
FIG. 6 is a cross-sectional view showing a portion of a semiconductor device according to the first embodiment of the present invention.

With reference to FIGS. 5 and 6, a semiconductor device according to the first embodiment of the present invention is described. This semiconductor device is a semiconductor device that includes low dielectric constant films 105a, 105b and 105c, of which the relative dielectric constant is less than 3.5, is provided with one or more seal rings 123 which is a moisture blocking wall in closed loop form in a plan view, and where at least one of seal rings 123 includes a seal ring protrusion portion 10 in inward protruding form in the vicinity of a chip corner 4. Though seal ring protrusion portion 10 has effects to a certain degree only in the case where it is in inward protruding form in the vicinity of chip corner 4, here, it has a more preferable configuration, such that it has a seal ring diagonal side 9 which forms approximately equal angles with two chip end surfaces 5 and 6 that form chip corner 4, and which faces chip corner 4. Though seal ring protrusion portion 10 has effects to a certain degree only in the case where it has seal ring diagonal side 9, here, it has a more preferable configuration, where a first side 7 and a second side 8 which are parallel to two chip end surfaces 5 and 6, respectively, that form chip corner 4.

This semiconductor device is provided with a sacrifice pattern 124 which is a structure in wall form for preventing the progress of cracks outside of seal ring protrusion portion 10 from the center of the chip. FIG. 6 is a cross-sectional view along line VI-VI as viewed in the direction of the arrows. Sacrifice pattern 124 may have a configuration where the upper portion of seal ring 123 is omitted, that is to say, where a wall is constructed in the same manner as that of seal ring 123 only in the portion that corresponds to the layers of low dielectric constant films 105a, 105b and 105c. Sacrifice pattern 124 that is to be a wall for preventing the progress of cracks has a structure where a number of wire layers are connected from the top and from the bottom through interlayer connection portions. The respective interlayer connection portions which are included in sacrifice pattern 124 are made of members in trench form instead of members in hole form.

Figure 7:
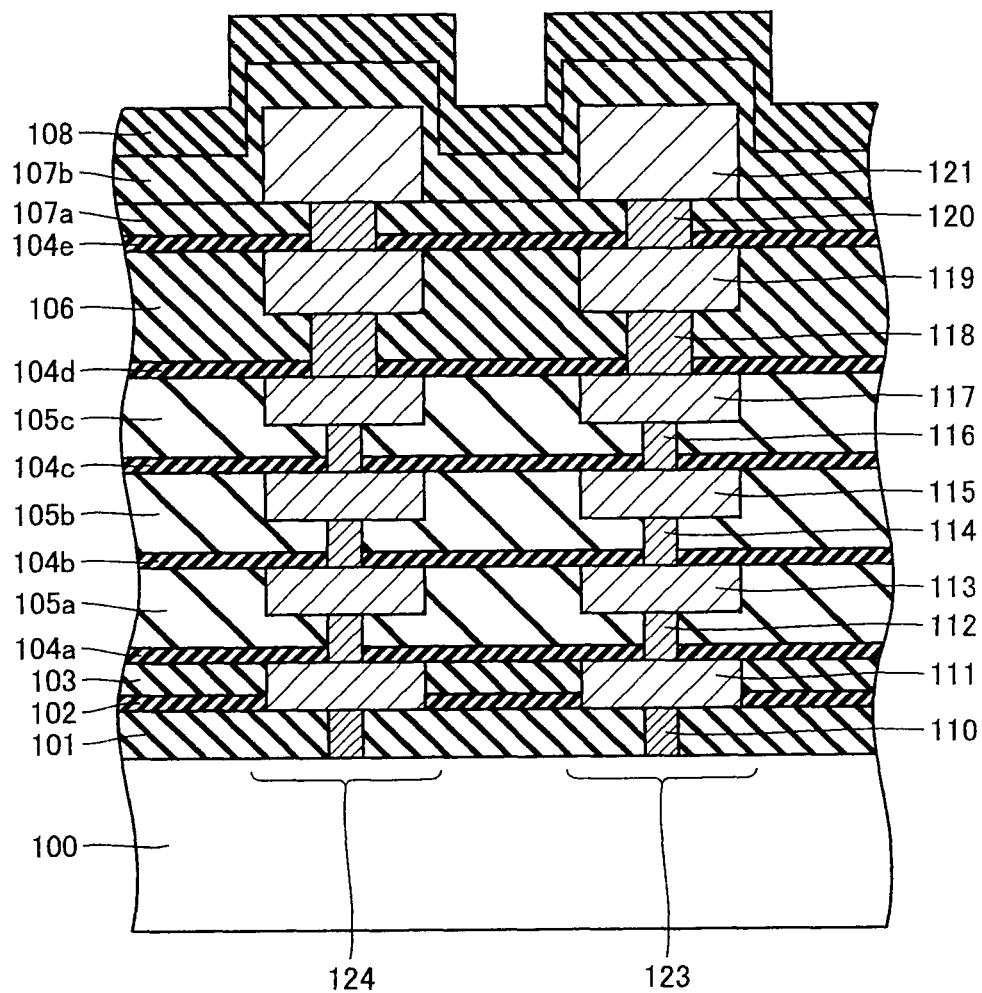
FIG. 7 is a cross-sectional view showing a portion of a semiconductor device in another example according to the first embodiment of the invention.

Here, as shown in FIG. 7, sacrifice pattern 124 may have a structure where it reaches the same height as seal ring 123, that is to say, the layer of the aluminum wire. Alternatively, a configuration where sacrifice pattern 124 extends upward to the same height as wire 119 in the configuration of FIG. 6, that is to say, a configuration where the height of the sacrifice pattern is somewhere between that of FIG. 6 and FIG. 7, for example, may be provided.

Though one or more sacrifice patterns such as sacrifice pattern 124 can provide to a certain degree the effects of the present invention, it is preferable to provide a number of sacrifice patterns, and therefore, a sacrifice pattern group 3 is formed of a number of sacrifice patterns such as sacrifice pattern 124 in the example of FIG. 5. Sacrifice pattern group 3 includes a sacrifice pattern 13 in straight line form, in addition to a number of sacrifice patterns in bent line form, such as sacrifice pattern 124. Each of sacrifice pattern 124 in bent line form forms approximately the same angle with two chip end surfaces 5 and 6 that form chip corner 4, and has a sacrifice pattern diagonal side 11 that faces chip corner 4. The closer to the center of the chip the sacrifice pattern is, the longer sacrifice pattern diagonal side 11 is.

According to the present embodiment, at least one seal ring 123 has a form that includes a seal ring protrusion portion 10 in inward protruding form in the vicinity of a chip corner 4, and therefore, cracks that originate from chip corner 4 and progress hit the seal ring in a form that is close to the form that is drawn by the ends of actual cracks, and as a result, it becomes possible to prevent the progress of cracks efficiently. Furthermore, in the present embodiment, seal ring protruding portion 10 has seal ring diagonal side 9, and therefore, seal ring 123 stands parallel to the diagonal side portion in the center of the ends of progressing cracks. Accordingly, it becomes difficult for seal ring 123 to be destroyed by cracks. Furthermore, according to the present embodiment, seal ring protruding portion 10 has a first side 7 and a second side 8, and therefore, seal ring 123 has a number of portions which are arranged parallel to progressing cracks, such as bended lines 24a and 24b shown in FIG. 2, and thus, becomes strong against cracking.

According to the present embodiment, sacrifice pattern 124 is arranged so that cracks that progress so as to spread from chip corner 4 are prevented from progressing before they reach seal ring 123 when they reach sacrifice pattern 124. Sacrifice pattern 124 is, as a whole, a structure made of a metal in wall form using interlayer connection portions in trench form, and therefore, even in the case where cracks that have progressed along an interface on the lower side of one low dielectric constant film hit a wire layer of a certain height of sacrifice pattern 124 and avoid the wire layer so as to pass over the wire layer and progress through the low dielectric constant film above this low dielectric constant film, further progress can be prevented.

According to the present embodiment, as shown in FIG. 5, a number of sacrifice patterns 124 are provided, and this number of sacrifice patterns make the probability of stopping the progress of cracks before the cracks reach seal ring 123 high, even in the case where the cracks partially destroy sacrifice pattern 124 so as to further progress to the inside. Furthermore, according to the present embodiment, each of sacrifice patterns 124 preferably has a sacrifice pattern diagonal side 11, and therefore, sacrifice pattern 124 stands parallel to a line drawn by the ends of cracking. Accordingly, sacrifice pattern 124 can effectively prevent the progress of cracks. Furthermore, the more cracks progress toward the center of the chip, the longer the diagonal side portion formed of the ends of cracks becomes, as shown in FIG. 2, and in the case where the semiconductor device is arranged in such a manner that the closer to the center of the chip, the longer sacrifice pattern diagonal side 11 becomes, as in the semiconductor device according to the present embodiment, sacrifice pattern diagonal side 11, which is longer than the previous one, is continuously hit by the diagonal side of the ends of cracks that becomes longer as cracks progress, and therefore, the progress of cracks can be effectively prevented.

In particular, in a preferable configuration, as shown in FIG. 5, a crack reaches seal ring 123 only in the case where all of sacrifice patterns 124 have been destroyed, and therefore, the function of sacrifice patterns 124, which are arranged in a limited area, can be most effectively utilized.

Figure 8:
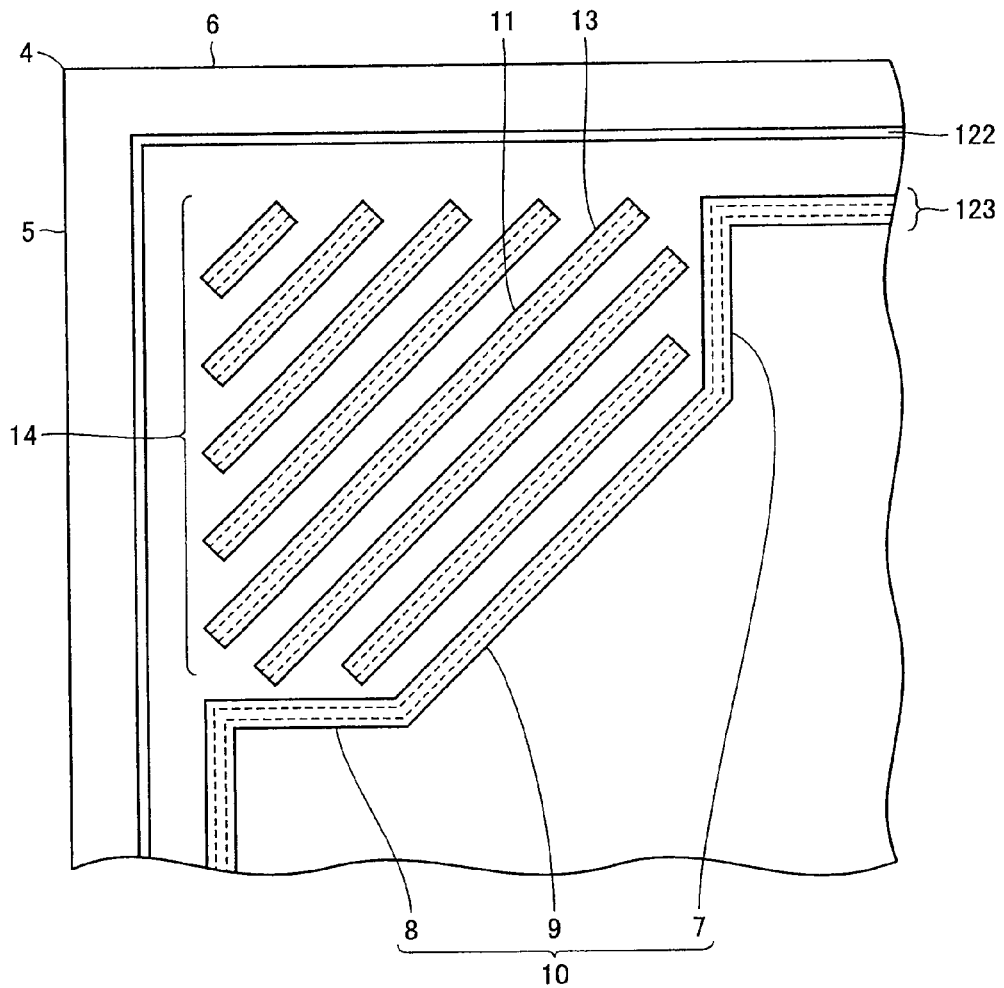
FIG. 8 is a cross-sectional view showing a portion of a semiconductor device in still another example according to the first embodiment of the invention.

Here, though in the example shown in FIG. 5, sacrifice pattern group 3 includes a number of sacrifice patterns 13 in straight line form and a number of sacrifice patterns 24 in bent line form, as shown in FIG. 8, a sacrifice pattern group 14 where only a number of sacrifice patterns 13 in straight line form are arranged parallel to each other may be provided instead of sacrifice pattern group 3. Though in this case, lines drawn by the ends of progressing cracks and the forms of sacrifice patterns do not necessarily coincide completely, effects are gained where the progress can be prevented by the number of sacrifice patterns 13 which stand one after another against the progressing cracks, and in addition, the merit of simple design is gained. Sacrifice patterns 13 also have a sacrifice pattern diagonal side 11.

A configuration where only one sacrifice pattern 13 in straight line form is arranged, a configuration where only one sacrifice pattern 124 in bent line form and a configuration where only one sacrifice pattern 13 in straight line form and only one sacrifice pattern 124 in bent line form, that is to say, only two lines in total, are arranged within a region that is surrounded by seal ring protrusion portion 10 also fall within the scope intended by the technical idea of the present invention, although the effects of suppressing the progress of cracks are smaller, in comparison with the aforementioned examples.

Here, though it is preferable for the number of sacrifice patterns 124 that are included in sacrifice pattern group 3 to be arranged in such a manner that the sacrifice patterns 124 that are closer to the center the chip have a longer sacrifice pattern diagonal side 11, effects can be gained to a certain degree, even in the case where only some of the number of sacrifice patterns 124 that are included in sacrifice pattern group 3 are aligned in such an order, in addition to the case where all sacrifice patterns 124 that are included in sacrifice pattern group 3 are aligned in such an order. Accordingly, it can be said that it is preferable for at least some of the number of sacrifice patterns to be arranged in such a manner that the sacrifice patterns that are closer to the center of the chip have a longer sacrifice pattern diagonal side.

Second Embodiment

Figure 9:
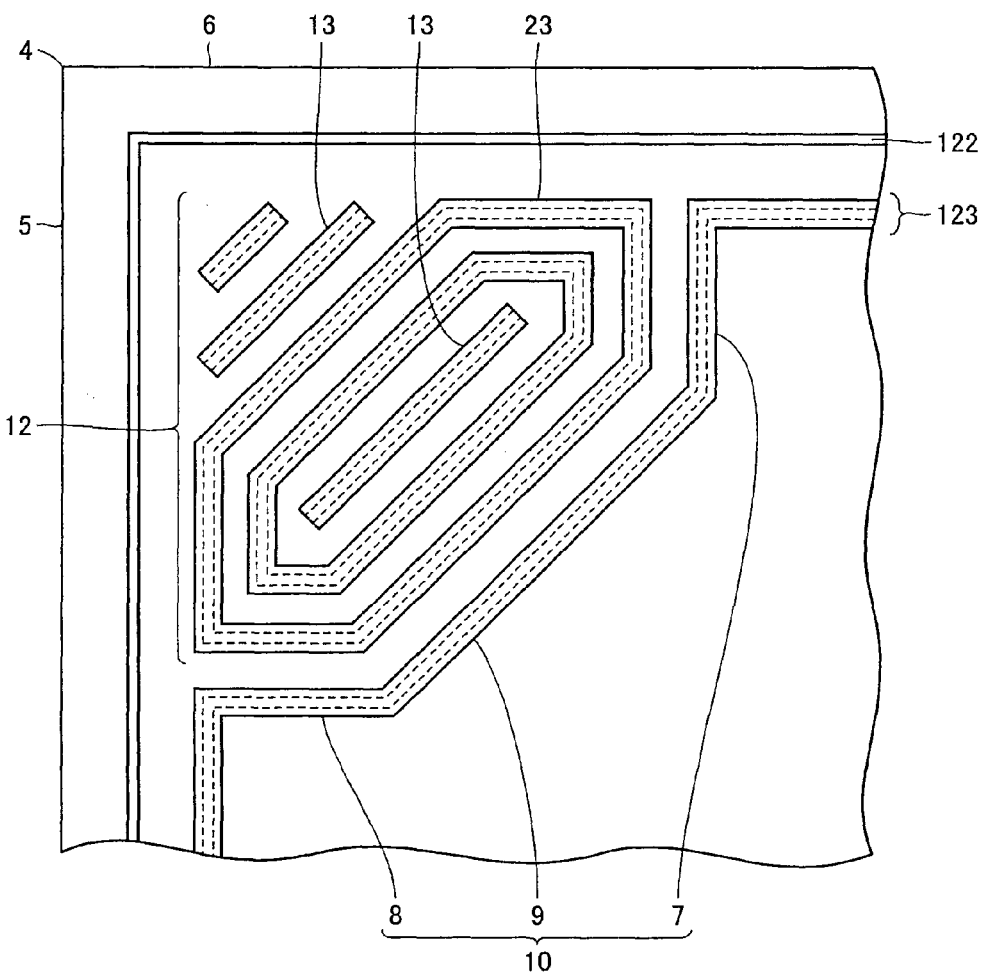
FIG. 9 is a plan view showing a portion of a semiconductor device according to the second embodiment of the present invention.

With reference to FIG. 9, a semiconductor device according to the second embodiment of the present invention is described. In this semiconductor device, a sacrifice pattern group 12 made of a number of sacrifice patterns is arranged within a region outside of a seal ring protrusion portion 10 from the center of the chip. Sacrifice pattern group 12 includes a sacrifice pattern in closed loop form. Preferably, as in the example shown in FIG. 9, sacrifice pattern group 12 includes a number of sacrifice patterns 23 in closed loop form, and the number of sacrifice patterns 23 in closed loop form are arranged in concentric form. The sacrifice patterns that are included in sacrifice pattern group 12 are parallel to seal ring 123 in the vicinity of seal ring 123. Some sacrifice patterns which are included in sacrifice pattern group 12 and in the vicinity of chip corner 4 are sacrifice patterns 13 in straight line form. The configuration of the other parts is the same as that described in the first embodiment.

According to the present embodiment, the group includes sacrifice patterns 23 in closed loop form, and therefore, moisture can be prevented from entering into the region surrounded by sacrifice patterns 23. Low dielectric constant films allow moisture to enter very easily, in comparison with silicon oxide films and the like. In the case where moisture enters into a low dielectric constant film, the physical strength further deteriorates, and moisture does not enter into the inside of sacrifice patterns 23 in closed loop form, as long as sacrifice patterns 23 are not destroyed, and therefore, deterioration in the physical strength of the low dielectric constant films can be prevented, and thus, the progress of cracks can be prevented. Particularly, in the case where a number of sacrifice patterns 23 in closed loop form are arranged in concentric form, the outermost sacrifice pattern 23 preferably provides broadly ranging collective regions into which no moisture enters. In the case where some sacrifice patterns in closed loop form on the outside are destroyed, some regions can be prevented from letting moisture in, if one or more sacrifice patterns in closed loop form remain on the inside.

Here, though the semiconductor device is provided with sacrifice pattern group 12 according to the present embodiment, an arrangement of only one sacrifice pattern in closed loop form, instead of sacrifice pattern group 12, has effects to a certain degree, even though the effects are inferior to the aforementioned example.

Third Embodiment

Figure 10:
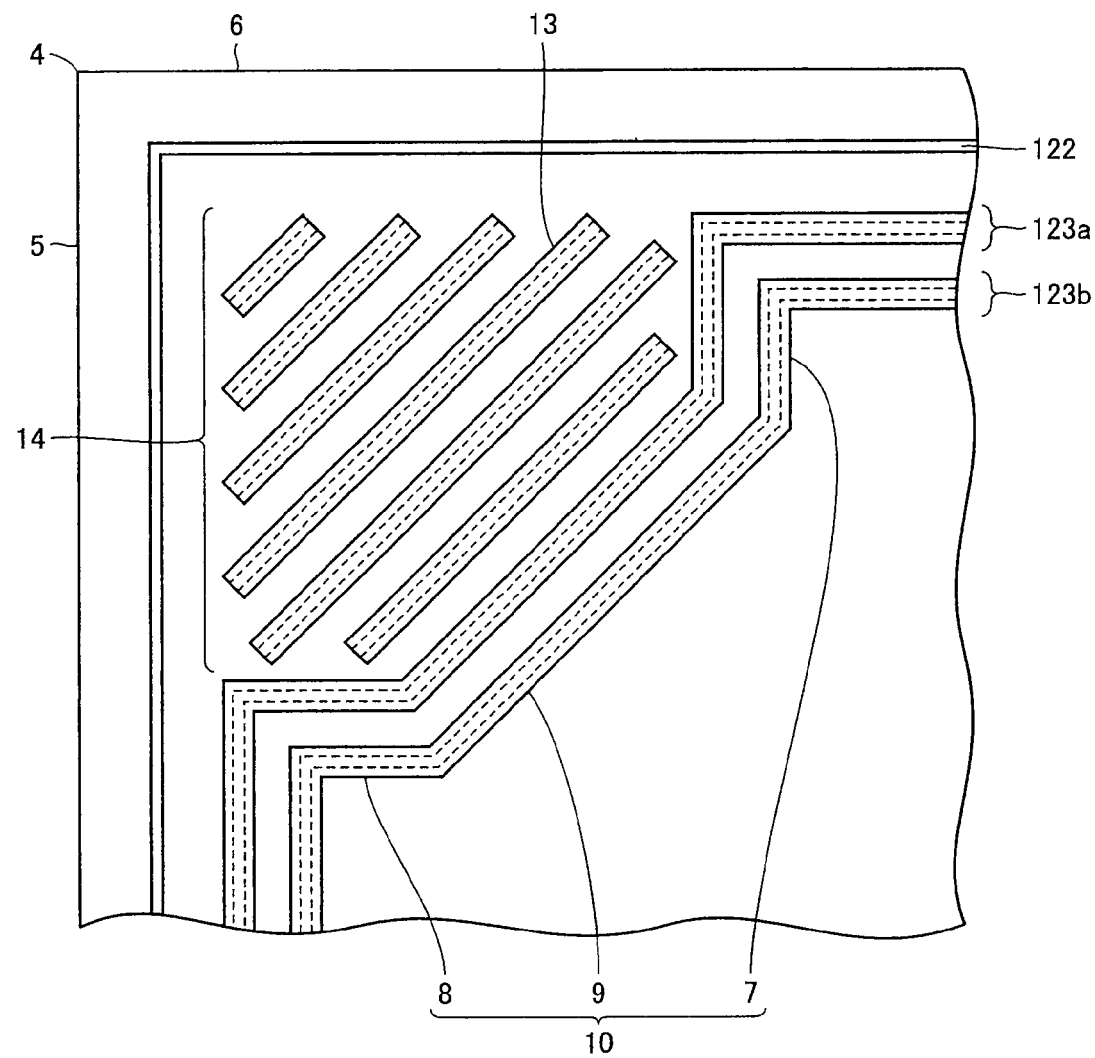
FIG. 10 is a plan view showing a portion of a semiconductor device according to the third embodiment of the present invention.

With reference to FIG. 10, a semiconductor device according to the third embodiment of the present invention is described. This semiconductor device corresponds to the example shown in FIG. 8 according to the first embodiment, where the seal ring is made double. That is to say, this semiconductor device is provided with a seal ring 123a and a seal ring 123b. A sacrifice pattern group 14 where a number of sacrifice patterns 13 in straight line form are provided is arranged outside of seal ring 123a from the center of the chip. Respective sacrifice patterns 13 form approximately the same angle with two chip end surfaces 5 and 6 that form a chip corner 4, and are arranged so as to face chip corner 4.

According to the present embodiment, more than one seal ring is provided, so that the probability of destruction of the seal ring that is the closest to the center of the chip, and thus, hindering of the operation of the device can be made low when cracking progresses.

Though according to the present embodiment, the seal ring is double, it may be triple or more, instead of double. Here, it is necessary to note that the area that can be utilized inside of the seal rings decreases when the number of seal rings is increased. Though according to the present embodiment, a configuration where more than one seal ring is introduced into the example of FIG. 8, the same idea can be applied to other configurations. In the examples of FIGS. 5 and 9, for example, the seal ring may be made multiple. The seal ring may be made multiple also in the below described examples of FIGS. 11 to 13.

Fourth Embodiment

Figure 11:
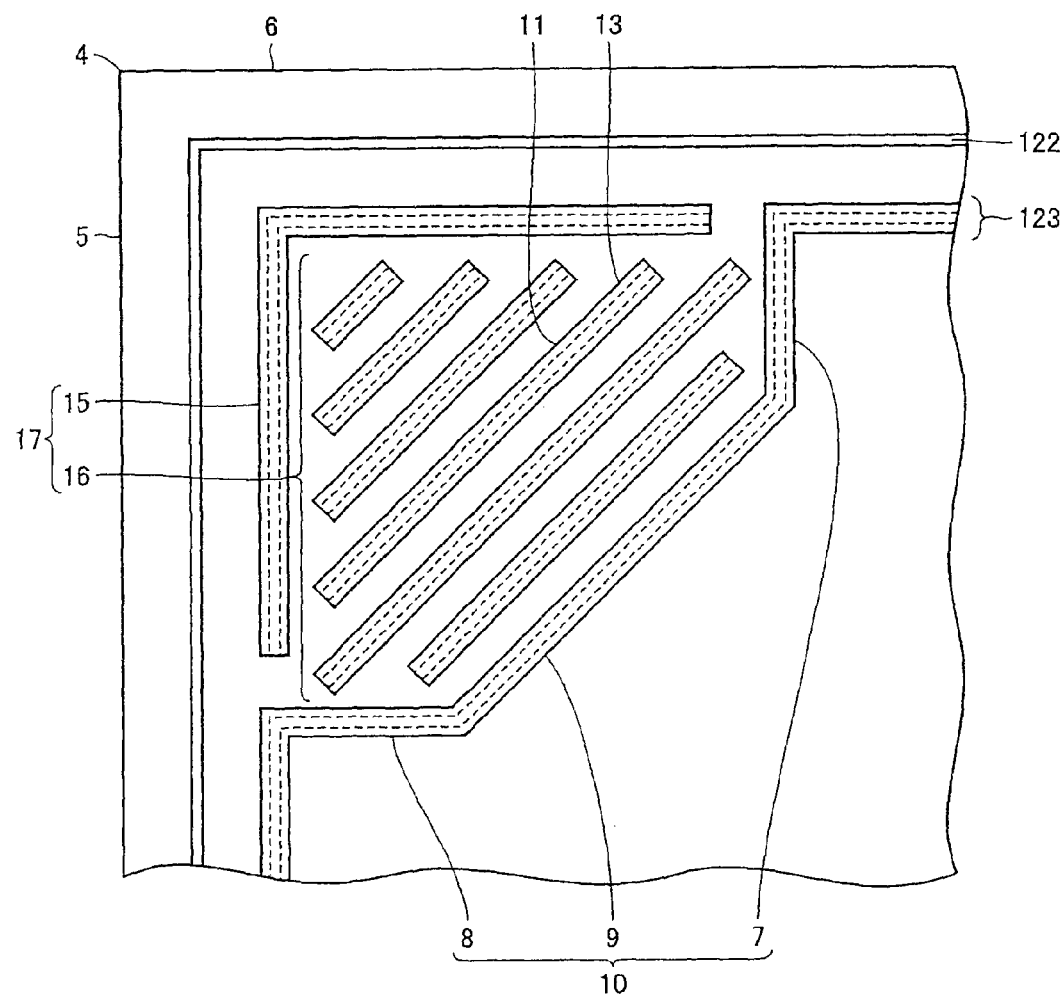
FIG. 11 is a plan view showing a portion of a semiconductor device according to the fourth embodiment of the present invention.

With reference to FIG. 11, a semiconductor device according to the fourth embodiment of the present invention is described. This semiconductor device is provided with a sacrifice pattern group 17 made of a number of sacrifice patterns. Sacrifice pattern group 17 includes an inner sacrifice pattern group 16 that is made of a number of sacrifice patterns 13 having sacrifice pattern diagonal sides 11 which form approximately the same angle with two chip end surfaces 5 and 6 that form a chip corner 4 and face chip corner 4, as well as a sacrifice pattern 15 in L shape which is arranged so as to surround inner sacrifice pattern group 16 from the outside and includes two sides which approximately form an L shape and are respectively parallel to two chip end surfaces 5 and 6 that form chip corner 4.

According to the present embodiment, sacrifice pattern 15 in L shape is provided, and therefore, initial cracks that have occurred, if any, from chip end surfaces 5 and 6 at the time of dicing of the wafer can be prevented from spreading to a certain degree, by sacrifice pattern 15 in L shape. In the case where cracks originating from these initial cracks progress toward the center of the chip during heat cycle testing, the number of sacrifice patterns 13 which are included inner sacrifice pattern group 16 prevent the progress of cracks. In this manner, the combination of sacrifice pattern 15 in L shape and inner sacrifice pattern group 16 makes prevention of the progress cracks effective. Here, though the example of FIG. 11 has one sacrifice pattern 15 in L shape, sacrifice pattern 15 in L shape may be double or more. In addition, though the example of FIG. 11 has a configuration where sacrifice pattern 15 in L shape is combined with the example of FIG. 8, a sacrifice pattern in L shape may be combined to other embodiments.

Fifth Embodiment

Figure 12:
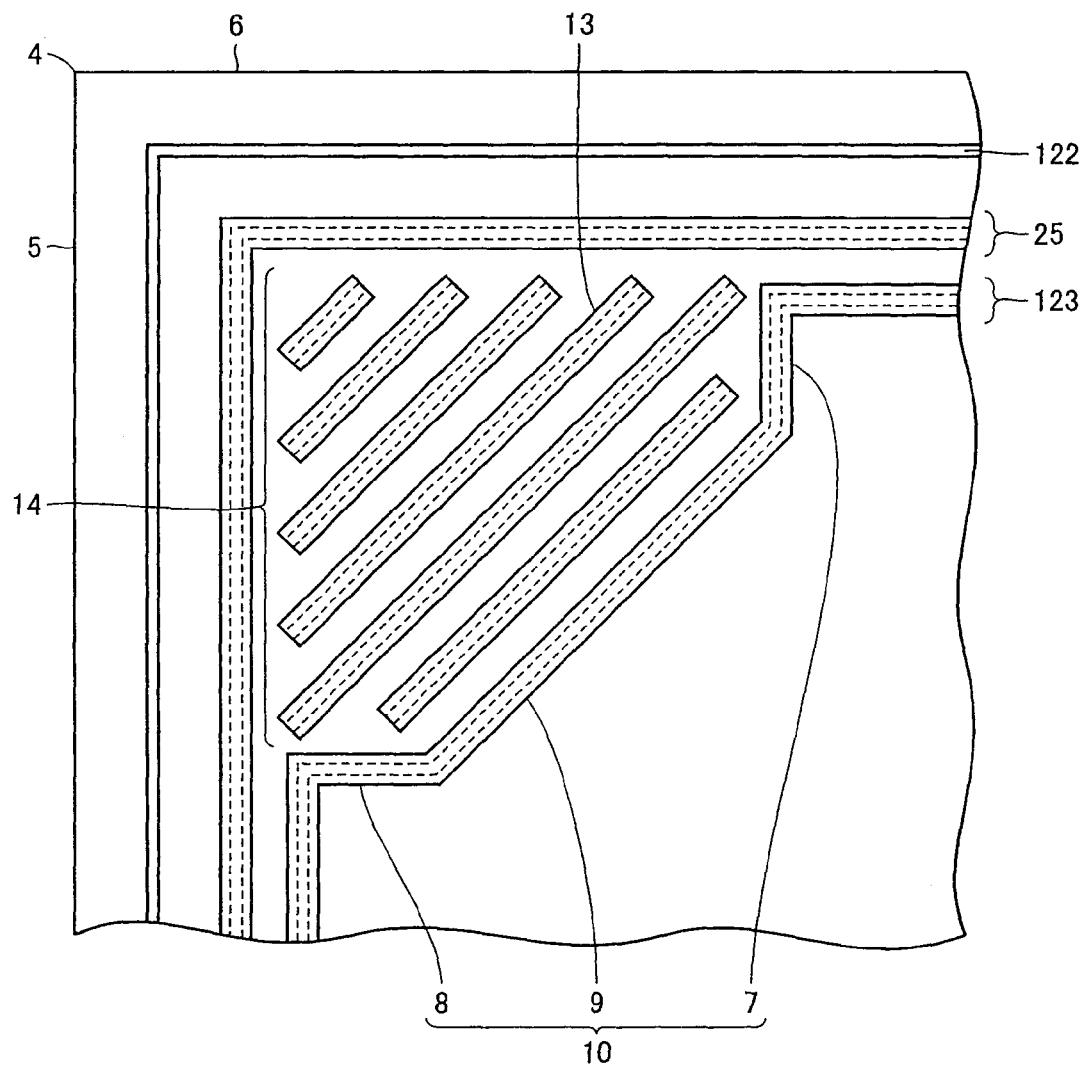
FIG. 12 is a plan view showing a portion of a semiconductor device according to the fifth embodiment of the present invention.

With reference to FIG. 12, a semiconductor device according to the fifth embodiment of the present invention is described. This semiconductor device corresponds to a device that has a configuration where an outer seal ring 25 is added to the example shown in FIG. 8 according to the first embodiment. That is to say, this semiconductor device is provided with a sacrifice pattern group 14 made of a number of sacrifice patterns 13, and outer seal ring 25, which is a moisture blocking wall in closed loop form in a plan view, is provided so as to surround sacrifice pattern group 14 and seal ring 123 from the outside of this sacrifice pattern group 14. Though FIG. 12 shows only a portion of the semiconductor device, outer seal ring 25 is connected to a portion that is not shown and arranged in closed loop form along the outer line of the entirety of the semiconductor device.

According to the present embodiment, outer seal ring 25 is provided, so that initial cracks that have occurred, if any, from chip end surfaces 5 and 6 at the time of dicing of the wafer can be prevented from spreading to a certain degree, by outer seal ring 25. Therefore, the same effects as those of the fourth embodiment can be gained. Furthermore, outer seal ring 25 has the function of preventing the inner region thereof from allowing moisture to enter, and therefore, the physical strength of the inner region of outer seal ring 25 can be prevented from deteriorating as a result of moisture that has entered.

Here, though outer seal ring 25 surrounds sacrifice pattern group 14 and seal ring 123 in the example of FIG. 12, an outer seal ring may be provided in the same manner, even in the case where there is only one sacrifice pattern instead of sacrifice pattern group 14.

Here, though one outer seal ring 25 is provided in the example of FIG. 12, outer seal rings 25 may be made double or more. In addition, though the example of FIG. 12 has a configuration where outer seal ring 25 is combined with the example of FIG. 8, an outer seal ring may be combined with other embodiments.

Sixth Embodiment

Figure 13:
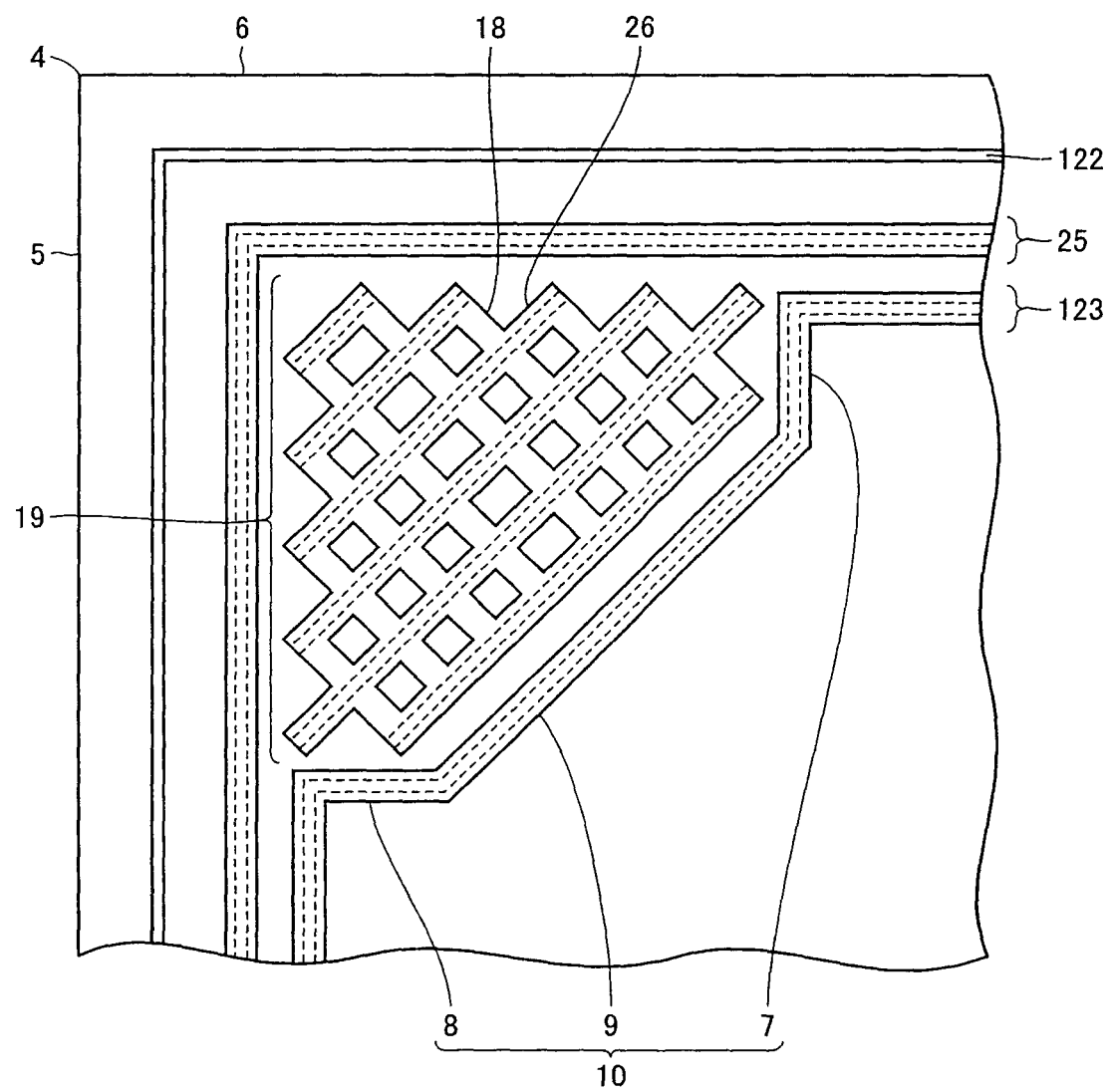
FIG. 13 is a plan view showing a portion of a semiconductor device according to the sixth embodiment of the present invention.

With reference to FIG. 13, a semiconductor device according to the sixth embodiment of the present invention is described. This semiconductor device is provided with a sacrifice pattern group 19. This semiconductor device corresponds to a device where sacrifice pattern group 14 is replaced with a sacrifice pattern group 19 in the example of FIG. 12. Though sacrifice pattern group 19 resembles sacrifice pattern group 14, it includes a linked layer 18 of which the portions are connected to each other. Sacrifice pattern group 19 is basically a collection of individual sacrifice patterns. In the example of FIG. 13, sacrifice pattern group 19 is a collection of a number of sacrifice patterns 26 in straight line form. Though sacrifice patterns 26 include a number of wire layers as viewed in the direction of the thickness, sacrifice patterns 26 are linked to each other in at least one layer from among the number of wire layers that exist in such a manner. The layer where sacrifice patterns are connected to each other in this manner is referred to as "linked layer" 18. It can be said that sacrifice pattern group 19 is a collection of the number of sacrifice patterns 26 in a state where they are linked to each other via linked layer 18.

According to the present embodiment, sacrifice patterns 26 are connected to each other by means of linked layer 18, and therefore, the strength of the entirety of sacrifice pattern group can be increased, and thus, the effect of opposing the progress of cracks can further be increased.

It is preferable for linked layer 18 to be in mesh form in a plan view, as in the example shown in FIG. 13. This is because such a structure can efficiently enhance the strength of the entirety. Here, the linked layer may be a single layer or made up of multiple layers.

Here, it is preferable for any of the aforementioned embodiments to have an arrangement where a sacrifice pattern blocks the lowest layer from among the low dielectric constant films. In the case where there is only one layer of a low dielectric constant film, "the lowest layer from among the low dielectric constant films" means this layer. Cracking easily occurs in the lowest layer from among the low dielectric constant films, and therefore, in the case where a sacrifice pattern is arranged so as to block the lowest layer from among the low dielectric constant films, the same phenomenon as that where cracks reach seal ring 123 after they have progressed along the interface on the lower side of a low dielectric constant film in FIG. 3 occurs for cracks and the sacrifice pattern in this case. That is to say, the effects become significant, particularly in terms of preventing the progress of cracks. It is preferable for a sacrifice pattern to be arranged so as to block the interface on the lower side of the lowest layer from among the low dielectric constant films.

Significant effects can be gained also in a semiconductor device that includes a number of low dielectric constant films according to the present invention. It is preferable for sacrifice patterns to be arranged so as to block all of the number of low dielectric constant films in the semiconductor device that includes the number of low dielectric constant films. As described with reference to FIG. 4, cracks tend to continuously progress by avoiding wire layers by passing over the wire layers and progressing through the layers above the wire layers when they reach the wire layers while progressing. In the case where sacrifice patterns are arranged so as to block all of the number of low dielectric constant films, however, cracking can be effectively prevented, even when cracks pass over the wire layers and into the layers above the wire layers, and thus, this is preferable.

Furthermore, it is preferable for all of the aforementioned embodiments to have an arrangement where a sacrifice pattern is separated from a seal ring in a plan view. In all of the aforementioned illustrations, the sacrifice patterns are arranged so as to be separated from the seal rings in a plan view, and this can lower the probability of a state occurring where the seal rings are peeled by being pulled by the displacement of a peeling portion, in the case where a sacrifice pattern is destroyed and peels.

Here, where, in each of the aforementioned embodiments, the expression "forms approximately the same angle with two chip end surfaces 5 and 6 that form a chip corner 4" is used when referring to the state of sealing diagonal side 9, sacrifice pattern diagonal side 11 and the like, this means a case where angles of 40° to 50° are formed for chip corner 4 that forms, for example, a right angle, in addition to a case where an angle of 45° is formed with the two respective chip end surfaces 5 and 6. That is to say, a state where a diagonal side is inclined at 40° relative to chip end surface 5 and inclined at 50° relative to chip end surface 6, for example, is also included in the expression. Here, a case where an angle of approximately 45° is formed for both of chip end surfaces 5 and 6 is most preferable. This is because such an arrangement can make the diagonal side oppose progressing cracks precisely head-on.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising a low dielectric constant film having a relative dielectric constant less than 3.5, and a seal ring which is a moisture blocking wall forming a closed loop in a plan view, wherein said seal ring includes a seal ring protrusion portion in inward protruding form in a vicinity of a corner of a chip, wherein a passivation film covers said low dielectric constant film and the seal ring, and has a opening penetrating the passivation film, the opening formed in a vicinity of two chip end surfaces in a plan view, said two chip end surfaces forming the corner of the chip, wherein a sacrifice pattern is provided outside of said seal ring protrusion portion of the seal ring from a center of a chip, wherein the sacrifice pattern is a structure in wall-form for preventing progress of a crack,
wherein said passivation film is made of a SiN,
wherein said seal ring includes a Cu seal ring and Al seal ring formed above said Cu seal ring and said sacrifice pattern includes a Cu sacrifice pattern, and
wherein an Al sacrifice pattern is not formed above said sacrifice pattern.

2. The semiconductor device according to claim 1,
wherein said sacrifice pattern has a sacrifice pattern diagonal side which forms approximately a same angle with the two chip end surfaces that form said corner, and has a sacrifice pattern diagonal side that faces said corner.

3. The semiconductor device according to claim 1, further comprising:
a number of low dielectric constant films that include said low dielectric constant film,
wherein said sacrifice pattern is configured to block a lowest layer from among said low dielectric constant films.

4. The semiconductor device according to claim 1, further comprising:
a number of low dielectric constant films that include said low dielectric constant film, wherein said sacrifice pattern is configured to block all of said number of low dielectric constant films.

5. The semiconductor device according to claim 1,
wherein said sacrifice pattern is configured to be separated from said seal ring in a plan view.

6. The semiconductor device according to claim 1, comprising:
a sacrifice pattern group that includes a plurality of the sacrifice patterns.

7. The semiconductor device according to claim 6,
wherein the plurality of the sacrifice patterns included in said sacrifice pattern group respectively have a sacrifice pattern diagonal side which forms approximately a same angle with the two chip end surfaces that form said corner and faces said corner.

8. The semiconductor device according to claim 7,
wherein at least some of said plurality of the sacrifice patterns are arranged so that sacrifice patterns that are closer to the center of the chip have a longer sacrifice pattern diagonal side.

* * * * *